United States Patent [19]

Bottard et al.

[11] 4,185,190

[45] Jan. 22, 1980

[54] DATA ACCUMULATION AND COMPRESSION APPARATUS

[75] Inventors: Gilles J. M. Bottard, Paris; Michel Henry, Louvres, both of France

[73] Assignee: Compagnie Internationale pour L'Informatique, CII-Honeywell Bull (Societe Anonyme), Paris, France

[21] Appl. No.: 876,139

[22] Filed: Feb. 8, 1978

Related U.S. Application Data

[63] Continuation of Ser. No. 625,662, Oct. 24, 1976, abandoned.

[51] Int. Cl.$^2$ .............................................. G06F 11/00
[52] U.S. Cl. ............................ 235/304; 340/347 DD
[58] Field of Search .................. 235/302.1, 304, 304.1, 235/310; 364/200, 900, 715; 340/347 DD

[56] References Cited

U.S. PATENT DOCUMENTS

| | | | |
|---|---|---|---|
| 3,490,690 | 1/1970 | Apple | 235/154 |
| 3,689,915 | 9/1972 | DeClerck | 340/347 DD |
| 3,715,573 | 2/1973 | Vogelsberg | 235/302.1 |
| 3,726,993 | 4/1973 | Lavallee | 340/347 DD |
| 3,772,654 | 11/1973 | Evans et al. | 364/200 |
| 3,916,387 | 10/1975 | Woodrum | 364/200 |

Primary Examiner—Charles E. Atkinson
Attorney, Agent, or Firm—Edward J. Kondracki

[57] ABSTRACT

Apparatus is disclosed for cumulative summing and compressing data items each of which is comprised of b binary elements. The summing and compressing apparatus is associated with control means to process each data item in a cumulative summing and compression cycle, and is comprised of an input buffer register which is designated to store a data item to be processed at the beginning of each cycle, a set of n intermediate registers occupying serial positions 1 to n each of which has b storage locations, an adder circuit, an output buffer register made up of n sections having b storage locations, and transfer circuits which are connected to the control means, which produces a succession of control signals for successively interconnecting (1) the registers in serial positions 1 to (n-1) and the input buffer register, to the adder circuit in order to add the contents of the (n-1) registers and the data item to be processed at the beginning of each cycle and to transfer the result of this addition to the input buffer register; (2) the registers in serial positions 2 to n, to the registers in serial positions 1 to (n-1)in order to transfer the content of each of the registers in serial positions 2 to n to the register which precedes it in the order given, (3) the register in serial position n and the input buffer register, to the adder circuit in order to add the contents of these registers and to transfer the result of this addition to the register in serial position n, and (4) the registers in serial positions 1 to n, in parallel to respective ones of the n sections of the output buffer register in order to transfer the contents of the n registers to the output buffer register so that, at the end of an $N^{th}$ cumulative summing and compression cycle, the contents of the output buffer register is a data item which has been compressed from a set of N data items which have been processed by the apparatus in N accumulation and compression cycles.

The invention is particularly concerned with locating a failure occurring in a data processing unit by determining a symptom which is the result of accumulation and packing a series of partial symptoms.

11 Claims, 3 Drawing Figures

DATA ACCUMULATION AND COMPRESSION APPARATUS

This is a continuation, of application Ser. No. 625,662, filed Oct. 24, 1976 now abandoned.

BACKGROUND OF THE INVENTION

1. Field of the Invention

The invention relates to an arrangement for cumulative summing and compressing digital data and in particular to such an arrangement which operates in conjunction with a computer.

2. State of the Prior Art

In data processing it often happens that operations are performed on non-significant items of data in an overall quantity of data which may be large. The result is frequently a considerable loss of time and a useless immobilisation of circuits and storage members such as the computer memories. In cases where data is remotely transmitted, it also frequently happens that the transmitted signals which represent this data are redundant too. For these reasons, existing arrangements make it possible, by compress ing the data before it is to be transmitted along a channel in a relatively short space of time, or else they allow a channel having a narrower pass band to be used so that the significant data is transmitted, thus removing the causes of redundancy to the maximum extent. Of known data compression arrangements, some are designed to analyse the word positions of the data to be transmitted to find non-significant word positions and replace them by a special character. Other arrangements are designed to find the significant positions in a data item and their positions in the grouping formed by the data item. Variable-length cyclic coding techniques have also been used to compress digital data. These techniques consist in transmitting with each non-redundant sample a binary image of the number or length of the redundant samples (which are not transmitted), which have appeared since the transmission of the previous sample. The position in a frame of any given data sample may then be found by adding the number of redundant and non-redundant samples preceding it. Using other known arrangements which combine the predictive coding and variable length cyclic coding techniques, it is possible to attain relatively high ratios of compression, a ratio of compression being defined as the ratio between the number of characters used by the data before compression and the number of characters used after compression. Since the majority of these different arrangements makes it necessary for the zones to be compressed to be examined character by character, they operate fairly slowly with the assistance of a computer. Other arrangements operate more quickly, but the results obtained are less satisfactory and the circuits of which they are made up are relatively complex.

Taking as an example the case of a list of words which has to be consulted, sucha as a language dictionary, it is found to be possible to lay down a maximum length, in the case of the longest word in the list, and an average length which applies to the majority of the words in the list and depends on the greatest frequency of occurence. This causes a waste of space which results from following the principle of storing words in zones of a fixed maximum length. In another case, where the data to be processed represents fault symptoms which are collected in order to perform a diagnosis, it is a long and expensive process to have the result of a test analysed by a program and requires in particular a considerable amount of space in the circuits of the computer, such as its memories, and also requires the intervention of a technical specialist to locate a fault. However, generally speaking, the probability of certain components failing is low, and most of the time, an accurate diagnosis may be made with the help of a dictionary which lists a number of faults very much smaller than the number of binary combinations which result from combining the symptoms collected, in accordance with the possible values of the latter.

SUMMARY OF THE INVENTION

One of the objects of the present invention is to dispense with the use of analytical means in the course of data compression, by compressing the data automatically whatever its origin and whatever the information content of each data item.

Another object of the invention is to compress data using means which make modest demands in terms of circuitry and time by ensuring that there is virtually no redundancy.

In accordance with these and other objects of the invention, apparatus is disclosed for cumulative summing and compressing data items each of which is comprised of b binary elements. The summing and compressing apparatus is associated with control means to process each data item in a cumulative summing and compression cycle, and is comprised of an input buffer register which is designed to store a data item to be processed at the beginning of each cycle, a set of n intermediate registers occupying serial positions 1 to n each of which has b storage locations, an adder circuit, an output buffer register made up of n sections having b storage locations, and transfer circuits which are connected to the control means which is designed to produce a succession of control signals as a result of which the following are connected successively:

1. the registers in serial positions 1 to $(n-1)$ and the input buffer register, to the adder circuit in order to add the contents of the $(n-1)$ registers and the data item to be processed at the beginning of each cycle and to transfer the result of this addition to the input buffer register, 2. the registers in serial positions 2 to n, to the registers in serial positions 1 to $(n-1)$ in order to transfer the content of each of the registers in serial positions 2 to n to the register which precedes it in the order given, 3. the register in serial position n and the input buffer register, to the adder circuit in order to add the contents of these registers and to transfer the result of this addition to the register in serial position n, 4. the registers in serial positions 1 to n, in parallel to respective ones of the n sections of the output buffer register in order to transfer the contents of the n registers to the output buffer register so that, at the end of an $N^{th}$ cumulative summing and compression cycle, the content of the output buffer register is a data item which has been compressed from a set of N data items which have been processed by the apparatus in N accumulation and compression cycles.

DESCRIPTION OF THE DRAWINGS

Other features and advantages of the invention will become apparent from the following description, which is given as a non-limiting example, and by referring to the accompanying figures.

DESCRIPTION OF THE PREFERRED EMBODIMENTS

Figure 1:
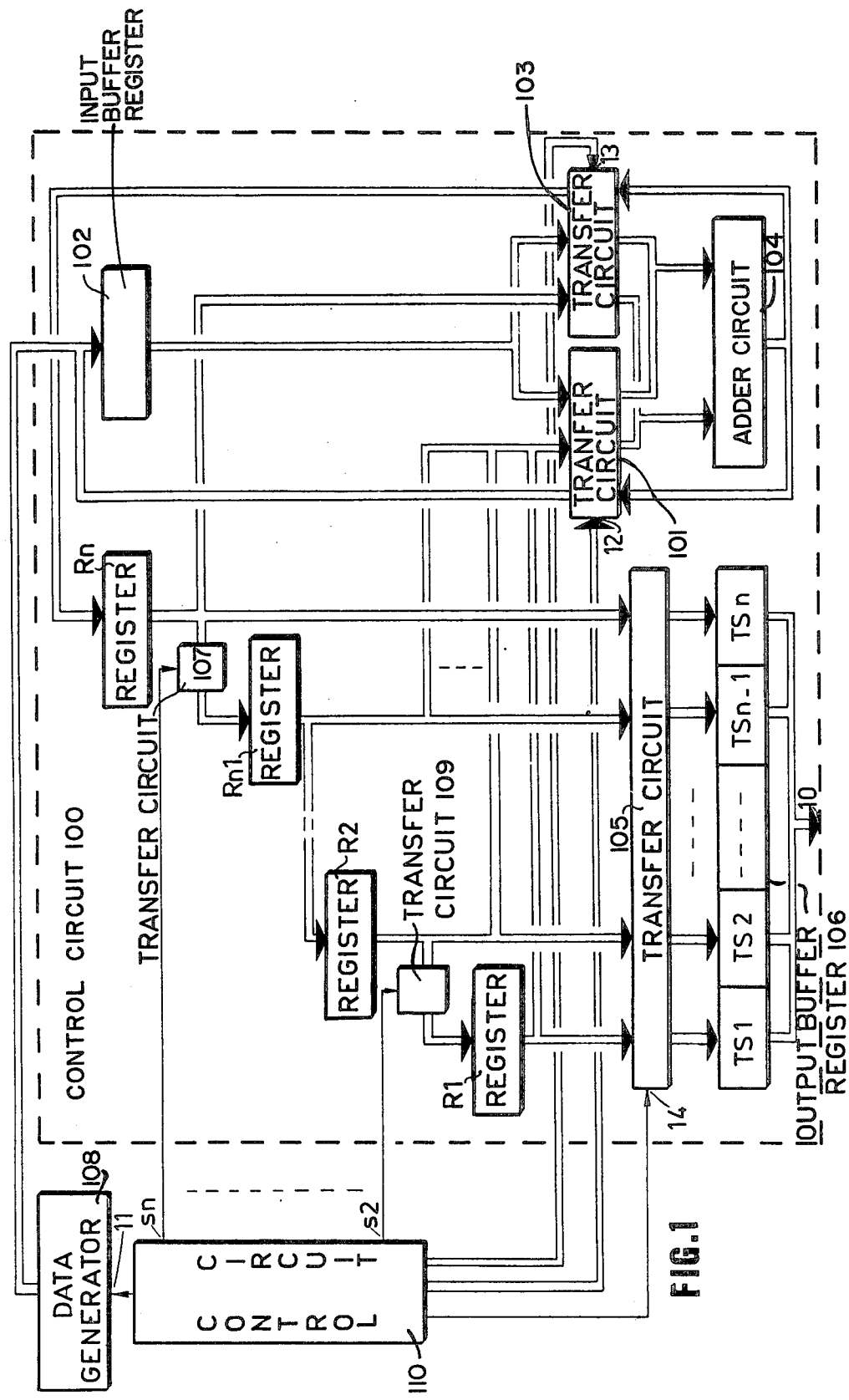
FIG. 1 is a diagrammatic showing of a data summing and compression apparatus in accordance with the teachings of this invention.

In FIG. 1 data summing and compression apparatus 100 according to the invention is comprised of an input buffer register 102, a set of n intermediate registers (R1, R2, ... Rn−1, Rn), an adder circuit 104, and an output buffer register 106 which is made up of n sections (TS1, TS2, ... TSn−1, TSn). A data generator 108 is connected to register 102 to allow the data items to be summed and compressed by the apparatus 100 to be fed successively into this register 102. A control circuit 100 is associated with each such arrangement 100 and with its generator 108. A data summing and compression cycle is defined by signals which are periodically transmitted by control circuit 110 to input 11 of generator 108. Each time a signal is emitted by control circuit 110, a new cycle begins and a new data item, which is a combination of b binary elements, is transmitted by generator 108 to the input buffer register 102. Registers 102, R1, R2, ... Rn are identical, as also are the n sections TS1, TS2, ... TSn, and each contains b storage locations. The intermediate registers R, the input buffer register 102, the output buffer register and the adder circuit are, per se, well-known in the art, as disclosed in "Arithmatic Operations in Digital Computers", by R. K. Richards, 1955 (D. Van Nostrand Company, Inc.); "Machine Design", April 22, 1971, pp. 124-149; "The Linear and Interface Circuits Data Book for Design Engineers", Texas Instruments, 1973; and "Supplement to the TTL Data Book for Design Engineers", Texas Instruments, 1974 At the beginning of each cycle, a data item having been stored in the input buffer register 102, register 102 and the first (n−1) intermediate registers R are connected to respective ones of two inputs of the adder circuit 104 by a transfer circuit 101 in order to add the contents of these registers R. The output of the adder circuit 104 is then connected to the input buffer register 102 by the transfer circuit 101 so that the result of the addition performed by the adder circuit 104 may be stored in the input buffer register 102. The various transfers performed by the transfer circuit 101 are controlled by signals which are transmitted by the control circuit 110 to input 12 of the transfer circuit 101. Intermediate registers R1, R2, ... , Rn−1, Rn, having been loaded in the previous cycle, then have their contents altered (with the exception of register Rn) as a result of a transfer which is performed between each intermediate register and the one preceding it in serial order, which transfers are performed by a set of n−1 circuits including transfer circuits 109 and 107. In this way the content of intermediate register R2, which was loaded in the course of the previous cycle is transferred to intermediate register R1 by transfer circuit 122, which latter circuit is controlled by a signal transmitted from output s2 of control circuit 110, whilst the previous content of intermediate register R1 is erased. The content of intermediate register Rn is transferred to intermediate register Rn−1 by transfer circuit 107 under the control of control circuit 110 which transmits a signal from its output sn, although the content of interest remains recorded in intermediate register Rn. The same content is added to the new content of input buffer register 102, registers 102 and Rn being connected to respective ones of the two inputs of the adder circuit 104 by transfer circuit 103. The result of this latter addition as derived from the output of the adder circuit 104 is transferred to intermediate register Rn by transfer circuit 103. The transfers performed by transfer circuit 103 are controlled by signals which are transmitted by control circuit 110 to input 13 of the transfer circuit 103. At the end of a cycle, the contents of the n intermediate registers (R1, R2, ... Rn) are transferred to respective ones of the n sections (TS1, TS2, ... TSn) of the output buffer register 106, via a transfer circuit 105 which is controlled by a signal transmitted by the control circuit 110 which is received at is input 14. At the end of each cycle a data item may be read from the output buffer register 106 at output 10 of the apparatus 100.

In cases where, for example, all the intermediate registers R are empty when the control circuit 100 is put into operation, a data item $S_1$ is loaded into input buffer register 102 by data generator 108 at the beginning of the first data summing and compression cycle and at the end of this first cycle, (n−1) intermiediate registers (R1, R2, ... Rn−1) are empty and register Rn contains data item $S_1$. Only data item $S_1$ is transferred to the input buffer register 102. If, at the beginning of the second cycle, a data item $S_1$ is loaded into the input buffer register 102, only the content of the intermediate register Rn is involved in its addition to the content of the input buffer register 102. At the end of the second cycle, (n−2) intermediate registers (R$_1$, ... Rn−2) are empty, intermediate register Rn−1 contains data item $S_1$, and intermediate register Rn contains the data item sum $(S_1+S_2)$. If, at the beginning of the third cycle, a data item $S_3$ is loaded into input buffer register 102, the first addition of the contents of (n−1) intermediate registers (R$_1$, ... Rn−1) and of the input buffer register 102 produces a sum equal to $(S_1+S_3)$. This result, when added to the content of intermediate register Rn in the second addition, gives the sum $(2S_1+S_2+S_3)$. At the end of the third cycle, the (n−3) intermediate registers (R$_1$, ... Rn−3) are empty, intermediate register Rn−2 contains data item $S_1$, intermediate register Rn−1 contains the sum $(S_1+S_2)$, and intermediate register Rn contains the sum $(2S_1+S_2+S_3)$. If $S_j$ is the data item introduced into input buffer register 102 at the beginning of the $j^{th}$ cycle, at the end of this cycle the (n−j+1)$^{th}$ intermediate register Rn−j+1 contains data item $S_1$, intermediate register Rn−2 contains the cumulative sum $SC_{j}-2$, intermediate register Rn−1 the cumulative sum $SC_{j}-1$, and intermediate register Rn the cumulative sum $SC_j$. In the next cycle, the result of processing a data item $S_{j}+1$ which is fed into input buffer register 102, is that the content of intermediate register Rn−j is data item $S_1$, the content of intermediate register Rn−j+1 is the sum $(S_1+S_2)$, the content of intermediate register Rn−2 is the cumulative sum $SC_{j}-1$, whilst intermediate register Rn−1 contains sum $SC_j$ and intermediate register Rn sum $SC_{j}+1$. If at the beginning of an $n^{th}$ cycle, data item $S_n$ is fed into input buffer register 102, at the end of this cycle the intermediate register R$_1$ contains data item $S_1$, register R2 contains the sum $(S_1+S_2)$, intermediate register Rn−2 contains the cumulative sum $SC_n-2$, intermediate register Rn−1 the sum $SC_n-1$ and intermediate register Rn contains the sum $SC_n$. The sum $SC_n$ is a function of all the data items $(S_1, S_2, S_3 ..., S_n)$ which are fed in at the respective beginnings of the n cycles and may be expressed as follows:

$$SC_n = f(S_1, S_2, \ldots S_{n-1}, S_n)$$
$$= S_1 + (S_1 + S_2) + \ldots + SC_{n-2} + SC_{n-1} + S_n$$

The following table shows the content of certain of the n intermediate registers R at the end of each of the first n data summing and compression cycles ($S_1, S_2, \ldots S_j, \ldots S_n$) performed by the apparatus 100 which is the subject of the present invention.

| Cycle | R1 | R2 ...... | Rn-j | Rn-j+1 .. | Rn-2 | Rn-1 | Rn |
|---|---|---|---|---|---|---|---|
| 1st | 0 | 0 ........ 0 | 0 ........ | 0 | 0 | 0 | $S_1$ |
| 2nd | 0 | 0 ........ 0 | 0 ........ | 0 | 0 | $S_1$ | $(S_1+S_2)$ |
| 3rd | 0 | 0 ........ 0 | 0 ........ | $S_1$ | | $(S_1+S_2)$ | $(2S_1+S_2+S_3)$ |
| jth | 0 | 0 ........ 0 | $S_1$ ........ | $SC_{j-2}$ | | $SC_{j-1}$ | $SC_j$ |
| (j+1)th | 0 | 0 | $S_1$ | $(S_1+S_2)$ .. $SC_{j-1}$ | | $SC_j$ | $SC_{j-1}$ |
| nth | $S_1$ | $(S_1+S_2)$ .................... | | | $SC_{n-2}$ | $SC_{n-1}$ | $SC_n$ |
| Nth | $SC_{N+1}$ ............................................................ | | | | | | $SC_N$ |

If the control circuit 100 is stopped at the end of the $N^{th}$, cycle at which time N data items ($S_1, S_2, \ldots S_n, \ldots S_N$) will have been fed in at the beginning of the N cycles performed by the apparatus, then at this time a compressed data item may be read from output buffer register 106 which is equivalent to the contents of all the n intermediate registers (R1, ... Rn), namely:

($SC_{N-n+1}, SC_{N-n+2}, \ldots SC_N$), where $SC_{N-n+1} = f(S_1, S_2, \ldots S_{N-n+1})$ $SC_{N-n+2} = f(S_1, S_2, \ldots S_{N-n+1}, S_{N-n+2})$ $SC_N = f(S_1, S_2, \ldots S_n, \ldots S_N)$ To juxtapose these N data items would require a register having N sections each containing b storage locations, that is to say a register having b×N storage locations. The output buffer register 106 from which may be read the said compressed data item has b×n storage locations. In the case illustrated by the table above, number N is greater than number n. Even if N is very much greater than n, the compressed sum read from output buffer register 106 at the end of the Nth cycle is still representative of the N data items summed and compressed by the apparatus which is the subject of the present invention, and it is contained in a register having b×n storage locations, b×n being in fact less than number b×N for the set of n uncompressed data items.

Figure 2:
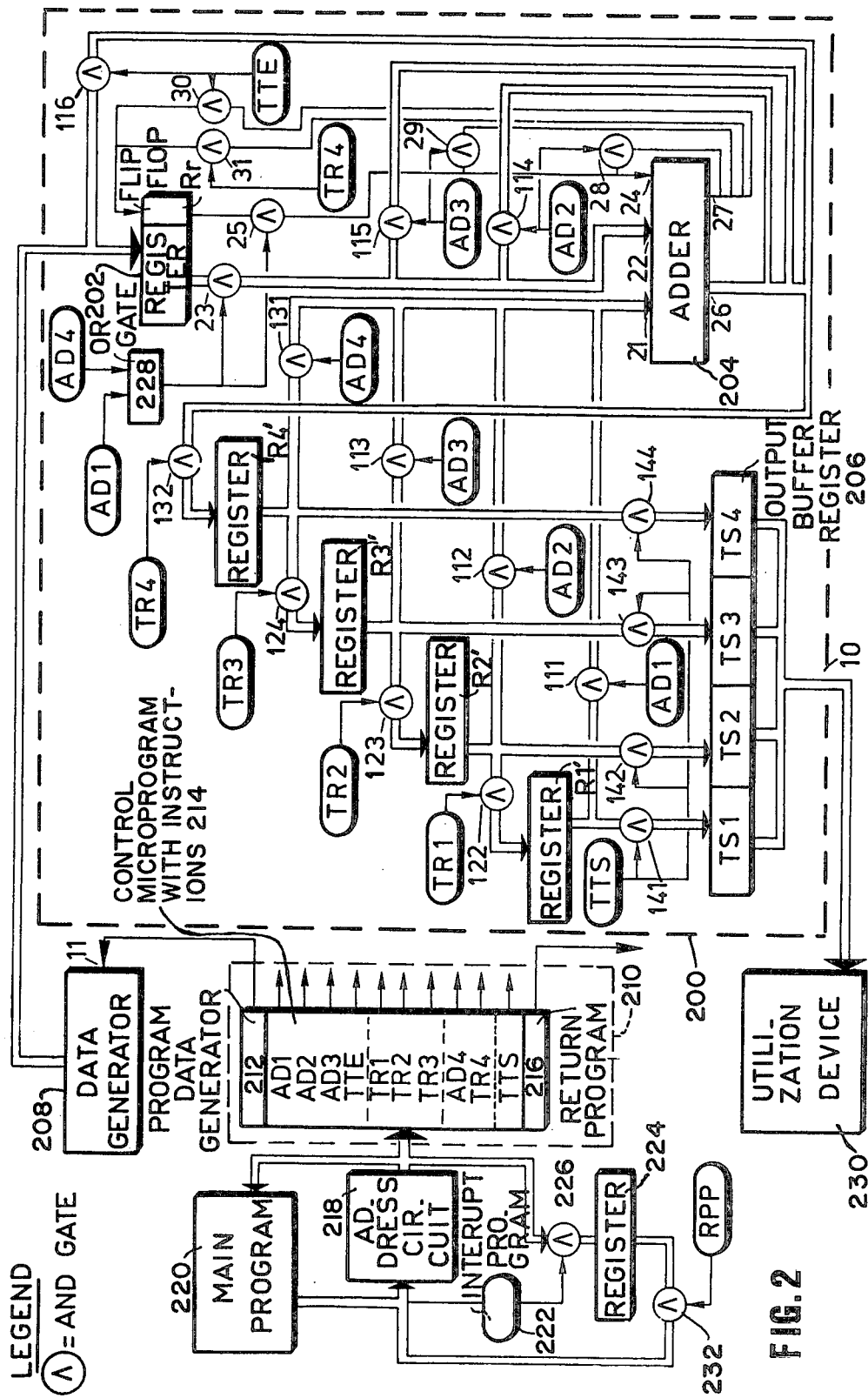
FIG. 2 is a diagram of an embodiment of a data summing and compression arrangement as shown in FIG. 1.

An illustrative embodiment of the arrangement of which the principle is illustrated in FIG. 1 is shown in FIG. 2, as also in an embodiment of the associated control circuit 210, which may illustratively comprise a programmable read only memory addressed by the address circuit 218. The apparatus 200 in FIG. 2 is made up of four intermediate registers R1', R2', R3', R4'. The transfer circuits 122, 123, 124 by which the content of intermediate register R2' is transferred to intermediate register R1', that of intermediate register R3' is transferred to intermediate register R2' and that of intermediate register R4' is transferred to intermediate register R3' are formed by logic AND gates of a type well known in the art. Transfer circuit 101 of FIG. 1 is comprised in FIG. 2 of AND gates 111, 112, 113 to transfer the contents of intermediate registers R1', R2', R3', respectively to input 21 of adder circuit 204. Input 22 of adder circuit 204 is connected to input buffer register of FIGS. 1 and 2 by an AND gate 23. In FIG. 2 flip-flop Rr arranged to store the carry item involved in each addition performed by the adder circuit 204 is connected to a third input 24 of the adder circuit 204 by an AND gate 25. Adder circuit 204 of FIG. 2 has a first output 26 which is separately connected to its input 22 by AND gates 114, 115 which correspond to a part of circuit 101 in FIG. 1, and a second output 27 which is separately connected to its input 24 by AND gates 28 and 29. Output 26 of the adder circuit 204 is further connected to the input buffer register 202 by an AND gate 116 which is part of circuit 101 in FIG. 1, whilst its output 27 is connected to flip-flop Rr by an AND gate 30. Intermediate register R4' is connected to the input of the register R3' by an AND gate 124 and to input 21 of the adder circuit 204 by an AND gate 131 forming part of circuit 103 in FIG. 1. Output 26 of the adder circuit 26 is connected to the intermediate register R4' by an AND gate 132 forming part of circuit 103 in FIG. 1 and its output 27 is connected to flip-flop Rr by an AND gate 31. In the illustrative embodiment in FIG. 2, a memory zone 212 is reserved in the programmable read only memory of the control circuit 210 to store the microprogram for generating data to be processed by the data cumulative summing and compression apparatus 200 and for loading the input buffer register 202 at the beginning of each processing cycle performed by this apparatus. A memory zone 214 is reserved in the programmable read only memory of the control circuit 210 to record a microprogram to control apparatus 200 is recorded in the memory zone following microprogram 212. This microprogram 214 is made up of microinstructions (AD1), (AD2), (AD3), (TTE), (TR1), (TR2), (TR3), (AD4) and (TR4), in that order. A memory zone 216 is reserved in the programmable read only memory of the control circuit 210 to store a microprogram for returning to the main microprogram which latter is recorded in another zone of the said memory or in another memory, after recording the other microprograms. In the case of FIG. 2, the microprograms from the memory zone are executed by addressing successive addresses in this memory zone by means of an addressing circuit 218. When a main program is being carried in the memory 220 by the addressing process performed by addressing circuit 218, an instruction 222 in this program causes the program to be interrupted. The address at which the interruption took place is safeguarded by being stored in a register 224 which is connected to the address circuit 218 by an AND gate 226, this gate 226 being enabled by a signal generated by interrupt instruction 222. An address which allows access to the data generating microprogram 212 is fed under the control of the main program 220 to circuit 218. By means of at least one signal which is transmitted to the input 11 of the signal generator 208 as a result of the running of the data generating microprogram, a data item is loaded into the input buffer register 202. In FIG. 2, since the microprograms are recorded at successive addresses in the memory zone by one-unit incrementations, the address circuit 218 allows access to microinstruction (AD1) after the data generating microprogram has been run. As a result of the execution of microinstruction (AD1), as signal is generated which enables gate 111 and gate 23 via an OR gate 228, to cause the contents of registers R1 and 202 to be added to the adder circuit 204. The microinstructions (AD1)—(TTE)—(TTS) are stored in the memory section in the order in which the memory is addressed, each of the aforementioned instructions being, for example an 8-bit word. Upon reading out of the aforementioned microinstructions, a memory output register, a part of the control circuit 210, is successively loaded with different words according to the different microinstructions. A decoder is disposed at the outputs of the memory output register to decode the different words stored in that register. The decoder generates enabling signals at its different outputs in a manner whereby predetermined words corresponding to the microinstructions as determined by the decoder are provided. Reference is made to the text "Digital Computer Fundamentals", by T. C. Bartee, Editions 1960, 1966, 1972 (McGraw Hill), that disclose the manner in which the memory may be so read out. Microinstruction (AD2) follows microinstruction (AD1) in the order in which the memory zone is addressed by the address circuit 218, to produce, when executed, a signal for enabling gates 112 and 114, as well as gate 28, so as to cause the content of register R2' and the result of the first addition to be added in the adder circuit 204, together with the carry item involved. Microinstruction (AD3) is then carried out and produces a signal which enables gates 113, 115 and gate 29 to allow the result of the second addition and the content of the intermediate register R3' to be added in the adder circuit 204 together with the new carry item. When the next microinstruction (TTE) is executed, this produces a signal to enable gates 116 and 30 to allow the result of the third addition to be transferred to the input buffer register 202 and the carry resulting from this addition to be transferred to flip-flop Rr. The transfer of the content of the intermediate register R2' to register R1' is brought about as a result of enabling gate 122, which is caused by a signal resulting from executing microinstruction (TR1). The transfer of the content of the intermediate register R3' to register R2' takes place as a result of the enabling of gate 123, which is caused by a signal generated by carrying out microinstruction (TR2). Executing microinstruction (TR3) generates a signal for enabling gate 124, via which gate the content of the intermediate register R4' is transferred to register R3'. By executing microinstruction (AD4) a signal is generated which enables gate 131 and gates 23 and 25 via the OR gate 228, to add the contents of registers R4' and 202 together with the carry item in flip-flop Rr. Microinstruction (TR4) is then executed, generating a signal for enabling gates 132 and 31 to transfer the result of the fourth addition to the intermediate register R4' and the last carry to flip-flop Rr. Finally, executing microinstructions (TTS) produces a signal for enabling four AND gates 141, 142, 143, 144, which correspond to circuit 105 in FIG. 1, to transfer the contents of the intermediate registers R1', R2', R3', R4' respectively to sections TS1, TS2, TS3, TS4 of the output buffer register 206 in FIG. 2 at the end of the current cycle. The cumulative summing and compression cycle carried out by the apparatus 200 is complete when the last microinstruction TTS has been carried out. The compressed data item which is then stored in the output buffer register 206 may be read by an utilization device 230 which is connected to its output 10. The microinstruction (RPP) which is carried out after microinstruction (TTS) is then run and produces a signal which enables the transfer of the content of register 224 to the address circuit 218 via an AND gate 232. The address which is loaded into the address circuit 218 in this way provides access to the main program at the address where it had previously been interrupted. As a result of a fresh interruption to the main program, a new summing and compression cycle is carried out by the apparatus 100 and 200, respectively, in FIGS. 1 and 2, as a result of its accessing or data generating microprogram 212 via the address circuit 218.

Figure 3:
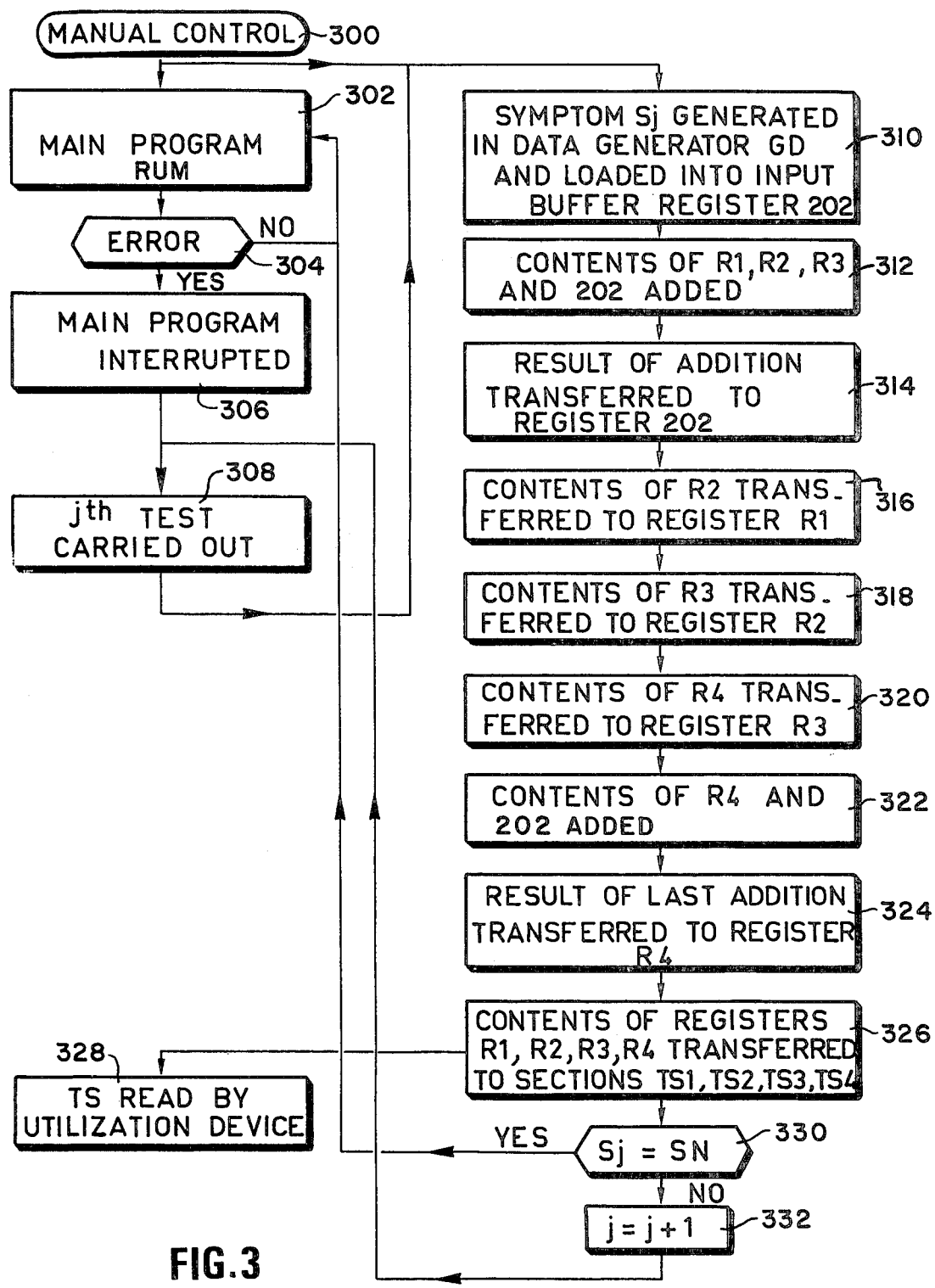
FIG. 3 is a flow chart of the operation of the apparatus according to the invention as shown in FIG. 2.

FIG. 3 is a flow chart, showing the operation of the apparatus 200 in FIG. 2, when the apparatus 200 is used to perform diagnosis on a set of H symptoms Sj (index j varying from 1 to N) which result from a set of N tests which are performed in succession in order to locate a fault in, for example, one component in a group of circuits. In this case the data generator 208, which is formed by at least one register, is connected to all the circuits to be tested by the N tests. Each test allows one symptom Sj to be received by data generator 208, which symptom is then loaded into the input buffer register 202 at the beginning of a compression and cumulative summing cycle which is brought about by control circuit 110 and 210, respectively, in FIGS. 1 and 2. In the case of FIG. 3, the circuits to be tested are those of a computer which also contains error detectors and testing means which are controlled by these detectors. By means of a manual control 300 the computer is made to perform the main program 214, as shown in FIG. 2. As long as no fault is detected, this program continues to be run as indicated in block 302. If an error occurs as detected in block 304, the main program 214 is interrupted as indicated in block 306 and a first ($j^{th}$) test is performed on the circuits as indicated in block 308 and a first symptom Sj is received by the data generator 208. When this first symptom is loaded as indicated in block 310 into the input buffer register 202 as a result of a signal which is transmitted to the input of data generator 208 by the control circuit 110 and 210, respectively, in FIGS. 1 and 2, it initiates a first summing and compression cycle carried out by the apparatus 200 as indicated in blocks 312 to 326 and the contents of the output buffer register 206 is read by the utilization device 230, as indicated in block 328. When this first cycle has been completed as determined in decision block 330, a second test is carried out on the circuits and a second symptom Sj 2 is received at data generator 208 which, by loading this symptom into the input buffer register 202 by means of a signal to its input 11, initiates a second summing and compression cycle. Thus, a series of tests and a series of cumulative summing and compression cycles are carried out alternately until, an $N^{th}$ symptom Sj equivalent to $S_N$ having been loaded into register 202 (at the conclusion of an $N^{th}$ test), an $N^{th}$ cycle is carried out and at the end of the cycle a symptom, which is the result of the N summed and compressed symptoms Sj, may be read from the output buffer register 106 and 206, respectively, in FIGS. 1 and 2 by the utilization device 230 in FIG. 2, which may for example be a display device. The $N^{th}$ cycle having been carried out or decided in block 330, a return is made to the main program. Each new item of data provided by the data generator 108 to the input buffer register 102 corresponds with the notation $j=j+1$ within block 332. The last item of data as provided by the data generator 108 corresponds with $j=N$. Thus, in FIG. 3 there is illustrated that a new cycle is initiated when a new item of data is stored in the input buffer register 102 or 202. In certain cases, where the means for testing the circuits of a computer consist of sub-programs which are fed into one of the memory zones, interrupting the main program causes, on the one hand, the address at which the interruption took place to be safeguarded as shown in FIG. 2, and, on the other hand, causes the address circuit 218 to read an address which gives it access to the first address of the memory zone in order to carry out the N tests. In certain cases where an apparatus such as that shown in FIGS. 1 and 2 is used, it is possible to feed the data items directly into the apparatus, in turn, by means of a manual control and at the end of each cycle to read the content of the output buffer register 206 by means of a device, such as the device in FIG. 2.

The use of the apparatus according to this invention is particularly beneficial in a system for testing a data processing unit and in particular for testing all of the functional members of this unit individually using a set of microprograms which are recorded in a memory belonging to the unit. In such a system a set of symptoms, such as the N symptoms Sj mentioned above, is collected by carrying out a microprogram for testing a functional member which involves carrying out a series of microinstructions for testing the components of this member. In the case of certain functional members of a unit with which the apparatus 200 in FIG. 2 may be associated, the numer N of symptoms collected as a result of testing one of them may be extremely high, i.e. of the order of several hundred for example, each symptom being represented by a combination of 8 bits. In this case, the compressed data item which is obtained in the output buffer register 206 in FIG. 2 is, at the conclusion of each cycle and in particular at the conclusion of the $N^{th}$ cycle, a combination of 32 bits which represents a function of the N symptoms which have been processed by the arrangement in N cycles. In this way, the present invention makes it possible, using a very small number of registers, to obtain a compressed symptom by means of which a fault may be located in a component of one of the functional members of the unit concerned. Generally speaking, a faulty data processing unit is diagnosed by collecting a series of symptoms by testing the unit, and then locating the faults by identifying at least one of the symptoms in a fault dictionary which gives a correspondence between the faulty component and at least one reference fault-symptom. The set of reference symptoms contained in this dictionary is obtained by successively simulating faults in the various components of each member. A fault in a component often manifests itself by a number of symptoms which have to be listed in the dictionary. What is more, the same fault symptom may be attributable to a number of components, which means that finding the fault in the dictionary is often a long process performed by trial and error. One of the significant features of the present invention is that it makes it possible to take account of a set of symptoms collected by testing the components of a member and to locate a fault swiftly and directly by identifying a single symptom in a fault dictionary, the symptom resulting from cumulative summing and compressing all the symptoms collected. In the case of FIG. 2, where each symptom fed into buffer register 202 is a combination of 8 bits, each symptom resulting from the summing and compression operations carried out by the apparatus 200 is a combination of 32 bits, which may be identified in a dictionary which contains a maximum of $2^{32}$ reference symptoms, which corresponds to a number of listed faults of the same order, for example 30,000. Thus as a result of the automatic summing and compression operations performed by the arrangement according to the invention, which apparatus is comprised of only a small number of circuits, a large number of data items may rapidly be collected together to make a very swift diagnosis. The compressed data item which is obtained at output 10 of the arrangement in FIG. 2 is relatively short and therefore may in certain cases be read and interrupted by non-specialist users. In cases where the invention is used for remote transmission, redundancy may be eliminated where there is a group of data items to be transmitted by summing and compressing the data items before transmitting them along a line.

The control circuit 210 associated with the apparatus 200 according to the invention is not limited to the embodiment shown in FIG. 2. The control signals which enable the arrangement for example, the apparatus 200 shown in FIG. 2 to perform the series of operations shown in FIG. 3 may be produced not only by microprograms recorded in a memory of an associated computer but also by clock circuits which are designed to suit the time-bases required for each individual operation performed by apparatus 100 and 200, respectively, in FIGS. 1 and 2, such an operation being a transfer from one register to another or the addition of the contents of two registers. Such clock circuits may be more advantageous when, for example, the apparatus according to the invention is used in a very large data processing unit.

As an example, the performance which may be achieved by an arrangement according to the invention when constructed as shown in FIG. 2 may be demonstrated by simulating series of tests each of which may produce 800 symptoms. For 9000 series of symptoms which differ from one another by very few bits, redundancy in the result is less than 0.2%. For 65,000 series of symptoms which differ considerably from one another there is no redundancy in the results.

With reference to the execution of microinstructions, the different microinstructions are coded on eight-bit words as follows:

| | |
|---|---|
| COD | 00000001 |
| AD1 | 00000010 |
| AD2 | 00000011 |
| AD3 | 00000100 |
| TTE | 00000101 |
| TR1 | 00000110 |
| TR2 | 00000111 |
| TR3 | 00001000 |
| AD4 | 00001001 |
| TR4 | 00001010 |
| TT6 | 00001011 |

This is an example where each word is deducted from the previous word by incrementing by 1. Such a list of different words, successively read by a memory output register and decided by a decoder, is made to generate enabling signals successively at different outputs of the decoder.

The list of operations performed by executing the microinstructions is as follows:

| | | |
|---|---|---|
| CGD | corresponds to | LOAD ONE ITEM OF DATA INTO TE |
| AD1 | corresponds to | ADD [TE, RΓ]+[R1] |
| AD2 | corresponds to | ADD [TE + R1, RΓ] + [R2] |
| AD3 | corresponds to | ADD [TE + R1 + R2, RΓ] + [R3] |
| TTE | corresponds to | TRANSFER [AD] INTO TE, RΓ |
| TR1 | corresponds to | TRANSFER [R2] INTO R1 |
| TR2 | corresponds to | TRANSFER [R3] INTO R2 |
| TR3 | corresponds to | TRANSFER [R4] INTO R3 |
| AD4 | corresponds to | ADD [TE + R1 + R2 + R3, RΓ] + [R4] |
| TR4 | corresponds to | TRANSFER [AD] INTO R4, RΓ ([TE + R1 + R2 + R3 + R4]) |
| TTS corresponds to | TRANSFER [R1] INTO TS1 | |
| | TRANSFER [R2] INTO TS2 | |
| | TRANSFER [R3] INTO TS3 | |
| | TRANSFER [R4] INTO TS4 | |

Having described a preferred embodiment for cumulative summing and compressing data items, each of which comprises b binary elements, in accordance with the present invention, other modifications and variations of the invention will be suggested to those skilled in the art in the light of the above teachings. It is therefore to be understood that changes may be made in the particular embodiments of the invention described which are within the full intended scope of the invention as defined by the appended claims.

I claim:

1. Apparatus for cumulative summing and compressing data items, each of which is comprised of b binary elements, said apparatus comprising:
   (a) input buffer means for storing a data item to be processed at the beginning of each cycle;
   (b) a plurality of n intermediate storing means coupled in serial positions 1 to n with respect to each other and each thereof comprising b storage locations;
   (c) adder means;
   (d) output storage means comprising n sections containing b storage locations;
   (e) control means for processing each data item in a cumulative summing and compression cycle; and
   (f) transfer means connected to said control means for interconnecting selectively said input storage means, said plurality of intermediate storing means, said adder means and said output storage means;
   (g) said control means comprising:
      (1) means for actuating said transfer means to connect said intermediate storing means in serial positions 1 to (n−1) and said input storing means, to said adder means, for actuating said adder means to add the contents of said intermediate storing means (n−1) and the data item to be processed at the beginning of each cycle and for transferring the result of this addition to said input storing means;
      (2) means for actuating said transfer means to connect said intermediate storing means in serial positions 2 to n to said intermediate storing means in serial positions 1 to (n−1), and for transferring the content of each of said intermediate storing means in serial positions 2 to n to said intermediate storing means which precedes it in the serial order given;
      (3) means for actuating said transfer means to connect said intermediate storing means in serial position n and said input storage means to said adder means, for actuating said adder means to add the contents of said aforementioned intermediate and input storing means and for transferring the result of this addition to said intermediate storing means in serial position n; and
      (4) means for actuating said transfer means to connect said intermediate storing means in serial positions 1 to n in parallel to respective ones of the n sections of said output storing means, for transferring the contents of said intermediate storing means to said output storing means so that, at the end of the Nth cumulative summing and compression cycle, the contents of said output storing means is a data item which has been compressed from a set of N data items which have been processed by said apparatus in N accumulation and compression cycles.

2. Summing and compressing apparatus according to claim 1, where said transfer means for connecting said plurality of intermediate storing means and said adder means in succession comprises AND gates, said control means successively providing and applying enabling signals to said AND gates.

3. Summing and compressing apparatus according to claim 2, wherein said control means comprises a general purpose, digital computer including a memory for storing a program comprising a series of microinstructions which the said computer is able to carry out in sequence.

4. Summing and compressing apparatus according to claim 3, wherein said apparatus comprises first, second, third and fourth intermediate storing means; each of said first, second, third and fourth storing means, each of said input storing means and each of said n sections of said output storing means comprising eight bit-storage locations.

5. Summing and compressing apparatus according to claim 4, said transfer means for connecting said first, second and third intermediate storing means in serial positions 1 to 3 and said input storing means to said adder means and for connecting said adder means to said input storing means, comprises first, second and third AND gates for connecting respectively said first, second and third intermediate storing means to a first input of said adder means, a fourth AND gate for connecting the input storing means to a second input of said adder means, fifth and sixth AND gates for connecting said first output of said adder means to its second input, and a seventh AND gate for connecting said second output of said adder means to the input of said input storing means, said first to seventh AND gates being enabled in succession by said control means.

6. Summing and compressing apparatus according to claim 4, wherein said transfer means for transferring the contents of said second, third and fourth storing means in serial positions 2 to 4, respectively, to said first, second and third storing means in serial positions 1 to 3, comprises first, second and third AND gates for connecting, respectively, said second, third and fourth intermediate storing means to said first, second and third storing means, respectively, and said first, second and third AND gates are enabled by successive enabling signals derived from said control means.

7. Summing and compressing apparatus according to claim 4, wherein said transfer means for transferring the contents of said fourth intermediate storing means in serial position 4 and of said input storing means to said adder means and for transferring the result of this addition from said adder means to said fourth intermediate storing means, comprise first and second AND gates for connecting said fourth intermediate storage means and said input storing means respectively to first and second inputs of said adder means, and a third AND gate for connecting an output of said adder means to said fourth intermediate storing means, said first, second and third AND gates being enabled in succession by enabling signals derived from said control means.

8. Summing and compressing apparatus according to claim 4, wherein said transfer means for transferring the contents of said first, second, third and fourth intermediate storing means in serial positions 1 to 4 to four sections of said output storing means, comprises first, second, third and fourth AND gates which connect said first, second, third and fourth storing means respectively to said four sections of said output storing means, said first, second, third and fourth AND gates being enabled simultaneously by enabling signals derived from said control means.

9. Summing and compressing apparatus according to claim 4, wherein said apparatus comprises a flip-flop, a second and a third input of said adder means being connected to said flip-flop for storing therein a carry item derived with an 8-bit result by a first addition by said adder means and to take this carry item into account in a second addition which is performed on the result of the first addition.

10. A method of operating an apparatus for cumulative summing and comprising data items, each of which is comprised of b binary elements, the apparatus being associated with control means for processing each data item in a cumulative summing and compressing cycle, and comprising:
(a) an input buffer register for storing a data item to be processed at the beginning of each cycle;
(b) a set of n intermediate registers serially correlated with each other in positions 1 to n, and each of said intermediate registers comprising b storage locations;
(c) an adder circuit;
(d) an output buffer register made up of n sections containing b storage locations; and
(e) transfer circuits which are connected to the control means for the apparatus,
said method comprising the steps of:
(1) connecting the intermediate registers in serial positions 1 to (n−1) and the input buffer register to the adder circuit, thereafter adding the contents of the intermediate registers (n−1) and the data item to be processed at the beginning of each cycle and then transferring the result of this addition to the input buffer register;
(2) connecting the intermediate registers in serial positions 2 to n to the intermediate registers in serial positions 1 to (n−1), and thereafter transferring the contents of each of the intermediate registers in serial positions 2 to n to the intermediate register which precedes it in the serial order given;
(3) connecting the intermediate register in serial position n and the input buffer register, to the adder circuit, then adding the contents of these registers, and thereafter transferring the result of this addition to the intermediate register in serial position n; and
(4) connecting the intermediate registers in serial positions 1 to n in parallel to respective ones of the n sections of the output buffer register, and then transferring the contents of the n registers to the output buffer register so that, at the end of the Nth cumulative summing and compression cycle, the contents of the output buffer register is a data item which has been compressed from a set of N data items which have been processed by said apparatus in N accumulation and compression cycles.

11. Apparatus for cumulative summing and compressing data items, each of which comprises b binary elements, said apparatus comprising:
(a) input buffer means for storing a data item to be processed at the beginning of each cycle;
(b) a plurality of n intermediate storing means coupled in serial positions 1 to n with respect to each other and each thereof comprising b storage locations;
(c) adder means;
(d) output storing means comprising n sections containing b storage locations;
(e) calculating means for processing each data item in a cumulative summing and compression cycle; and
(f) transfer means connectable to said calculating means for interconnecting selectively said input storing means, said plurality of intermediate storing means, said adder means and said output storing means;
(g) said calculating means including sequencing means having the following components:
(1) means for actuating said transfer means to connect said intermediate storing means in serial positions 1 to (n−1) and said input storing means, to said adder means, for actuating said adder means to add the contents of said intermediate storing means (n−1) and the data item to be processed at the beginning of each cycle and for transferring the result of this addition to said input storing means;

(2) means for actuating said transfer means to connect said intermediate storing means in serial positions 2 to n to said intermediate storing means in serial positions 1 to (n−1), and for transferring the contents of each of said intermediate storing means in serial positions 2 to n to said intermediate storing means which precedes it in the serial order given;

(3) means for actuating said transfer means to connect said intermediate storing means in serial position n and said input storing means, to said adder means, for actuating said adder means to add the contents of said aforementioned intermediate and input storing means and for transferring the result of this addition to said intermediate storing means in serial position n; and (4) means for actuating said transfer means to connect said intermediate storing means in serial positions 1 to n in parallel to respective ones of the n sections of said output storing means, for transferring the contents of said n intermediate storing means to said output storing means so that, at the end of an Nth cumulative summing and compression cycle, the contents of said output storing means is a data item which has been compressed from a set of N data items which have been processed by said apparatus in N accumulation and compression cycles.

* * * * *

UNITED STATES PATENT AND TRADEMARK OFFICE
CERTIFICATE OF CORRECTION

PATENT NO. : 4,185,190

DATED : January 22, 1980

INVENTOR(S) : GILLES JEAN MARCEL BOTTARD, et al

It is certified that error appears in the above-identified patent and that said Letters Patent are hereby corrected as shown below:

Continuation of Serial No. 625,662 reads "Oct. 24, 1976", and should read --Oct. 24, 1975--.

IN THE ABSTRACT:

Col. 2, line 2, "designated" should be --designed--
Col. 1, line 2, "b" should be --$\underline{b}$--
Col. 2, line 3, "n" should be --$\underline{n}$--
Col. 2, line 4, "n" and "b" should be --$\underline{n}$-- and --$\underline{b}$--
Col. 2, line 6, "n" and "b" should be --$\underline{n}$-- and --$\underline{b}$--
Col. 2, line 15, "n" should be --$\underline{n}$--
Col. 2, line 17, "n" should be --$\underline{n}$--
Col. 2, line 19, "n" should be --$\underline{n}$--
Col. 2, line 22, "n" should be --$\underline{n}$--
Col. 2, line 23, "n" and "n" should be --$\underline{n}$-- and --$\underline{n}$--
Col. 2, line 24, "n" should be --$\underline{n}$--

IN THE CLAIMS:

Claim 1, col. 11, line 53, "b" should be --$\underline{b}$--

UNITED STATES PATENT AND TRADEMARK OFFICE
CERTIFICATE OF CORRECTION

PATENT NO. : 4,185,190

DATED : January 22, 1980

INVENTOR(S) : GILLES JEAN MARCEL BOTTARD, et al

It is certified that error appears in the above-identified patent and that said Letters Patent are hereby corrected as shown below:

IN THE CLAIMS: (continued)

Claim 1, col. 11, line 57, "n" should be --$\underline{n}$--
Claim 1, col. 11, line 58, "n" should be --$\overline{n}$--
Claim 1, col. 11, line 59, "b" should be --$\overline{b}$--
Claim 1, col. 11, line 61, "n" should be --$\overline{n}$--
Claim 1, col. 11, line 62, "b" should be --$\overline{b}$--
Claim 1, col. 12, line 12, "n" should be --$\overline{n}$--
Claim 1, col. 12, line 15, "n" should be --$\overline{n}$--
Claim 1, col. 12, line 18, "n" should be --$\overline{n}$--
Claim 1, col. 12, line 41, "n" should be --$\overline{n}$--
Claim 1, col. 12, line 44, "n" and "n" should be --$\underline{n}$-- and --$\underline{n}$--
Claim 4, col. 13, line 1, "n" should be --$\underline{n}$--
Claim 10, col. 13, line 67, "b" should be --$\underline{b}$--
Claim 10, col. 14, line 5, "n" should be --$\underline{n}$--
Claim 10, col. 14, line 6, "n" should be --$\overline{n}$--
Claim 10, col. 14, line 7, "b" should be --$\underline{b}$--
Claim 10, col. 14, line 9, "n" should be --$\overline{n}$--
Claim 10, col. 14, line 10, "b" should be --$\overline{b}$--
Claim 10, col. 14, line 22, "n" should be --$\overline{n}$--

UNITED STATES PATENT AND TRADEMARK OFFICE
CERTIFICATE OF CORRECTION

PATENT NO. : 4,185,190

DATED : January 22, 1980

INVENTOR(S) : GILLES JEAN MARCEL BOTTARD, et al

It is certified that error appears in the above-identified patent and that said Letters Patent are hereby corrected as shown below:

IN THE CLAIMS: (continued)

Claim 10, col. 14, line 25, "n" should be --n̲--
Claim 10, col. 14, line 28, "n" should be --n̲--
Claim 10, col. 14, line 31, "n" should be --n̲--
Claim 10, col. 14, line 34, "n" should be --n̲--
Claim 10, col. 14, line 35, "n" should be --n̲--
Claim 10, col. 14, line 36, "n" should be --n̲--
Claim 10, col. 14, line 37, "n" should be --n̲--
Claim 11, col. 14, line 45, "b" should be --b̲--
Claim 11, col. 14, line 49, "n" should be --n̲--
Claim 11, col. 14, line 50, "n" should be --n̲--
Claim 11, col. 14, line 51, "b" should be --b̲--
Claim 11, col. 14, line 53, "n" should be --n̲--
Claim 11, col. 14, line 54, "b" should be --b̲--
Claim 11, col. 15, line 5, "n" should be --n̲--
Claim 11, col. 15, line 8, "n" should be --n̲--
Claim 11, col. 15, line 11, "n" should be --n̲--
Claim 11, col. 16, line 2, "n" should be --n̲--
Claim 11, col. 16, line 5, "n" and "n" should be --n̲-- and --n̲--
Claim 11, col. 16, line 7, "n" should be --n̲--

Signed and Sealed this

Twenty-eighth Day of April 1981

[SEAL]

Attest:

RENE D. TEGTMEYER

Attesting Officer

Acting Commissioner of Patents and Trademarks

UNITED STATES PATENT AND TRADEMARK OFFICE
CERTIFICATE OF CORRECTION

PATENT NO. : 4,185,190

DATED : January 22, 1980

INVENTOR(S) : Gilles Jean Marcel Bottard et al.

It is certified that error appears in the above-identified patent and that said Letters Patent is hereby corrected as shown below:

On The Title Page insert

-- (30) Foreign Application Priority Data

Oct. 28, 1974    France......74-36011 --.

Signed and Sealed this

Twenty-sixth Day of October 1982

[SEAL]

Attest:

GERALD J. MOSSINGHOFF

Attesting Officer    Commissioner of Patents and Trademarks